(12) United States Patent   (10) Patent No.: US 8,551,873 B2
Onuki et al.   (45) Date of Patent: Oct. 8, 2013

(54) METHOD FOR MANUFACTURING SEMICONDUCTOR DEVICE

(75) Inventors: Yusuke Onuki, Fujisawa (JP); Takehito Okabe, Atsugi (JP); Hideaki Ishino, Fujisawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 13/610,142

(22) Filed: Sep. 11, 2012

(65) Prior Publication Data

US 2013/0089975 A1   Apr. 11, 2013

(30) Foreign Application Priority Data

Oct. 6, 2011 (JP) ................................. 2011-222350

(51) Int. Cl.
*H01L 21/28* (2006.01)
(52) U.S. Cl.
USPC ....... 438/585; 438/595; 438/694; 257/E21.19
(58) Field of Classification Search
USPC .......................................... 438/585, 595, 694
See application file for complete search history.

(56) References Cited

U.S. PATENT DOCUMENTS

| | | | | |
|---|---|---|---|---|
| 6,010,923 | A * | 1/2000 | Jinno | 438/158 |
| 6,610,604 | B1 * | 8/2003 | Ang et al. | 438/694 |
| 6,830,979 | B2 | 12/2004 | Wada | |
| 6,995,434 | B2 | 2/2006 | Usui et al. | |
| 8,334,560 | B2 * | 12/2012 | Pan et al. | 257/316 |
| 2003/0082862 | A1 * | 5/2003 | Richter et al. | 438/197 |
| 2010/0048024 | A1 * | 2/2010 | Sugimura | 438/702 |

FOREIGN PATENT DOCUMENTS

| | | |
|---|---|---|
| JP | 8-083785 A | 3/1996 |
| JP | 8-111525 A | 4/1996 |
| JP | 2003-045821 A | 2/2003 |
| JP | 2003-045894 A | 2/2003 |
| JP | 2003-282860 A | 10/2003 |
| JP | 2004-146813 A | 5/2004 |

* cited by examiner

*Primary Examiner* — Alexander Ghyka
(74) *Attorney, Agent, or Firm* — Fitzpatrick, Cella, Harper & Scinto

(57) ABSTRACT

A method for manufacturing a semiconductor device having a MOS transistor, includes forming a gate electrode material layer on a first insulating film formed on a semiconductor substrate, forming an etching mask on the gate electrode material layer, forming a gate electrode by patterning the gate electrode material layer such that a protective film that protects at least a lower portion of a side face of the gate electrode and a portion of the first insulating film, which is adjacent to the side face, is formed while the gate electrode material layer is patterned, forming a second insulating film on the semiconductor substrate on which the gate electrode is formed, and forming an interlayer insulation film on the second insulating film.

8 Claims, 9 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device.

2. Description of the Related Art

Japanese Patent Laid-Open No. 2003-282860 has disclosed a method for forming a gate insulating film on the face of a silicon substrate, forming a gate electrode on the gate insulating film, removing the exposed gate insulating film by wet etching, and forming an oxide film on the gate electrode and the exposed portion of the silicon substrate by thermal oxidation. In this method, undercuts are formed in lower portions of the side faces of the gate electrode by wet etching. These undercuts are reduced by thermal oxidation following wet etching, and filled with the silicon oxide film formed by low-pressure CVD following thermal oxidation.

When the undercuts as described above are formed, variations are readily produced in the structure of the end portion of the gate insulating film, and this can vary the characteristics (for example, the threshold value and current driving capability) of a MOS transistor.

SUMMARY OF THE INVENTION

The present invention provides a technique advantageous for reducing the variations in characteristics of a MOS transistor.

One of the aspects of the present invention provides a method for manufacturing a semiconductor device including a MOS transistor, the method comprising: forming a gate electrode material layer on a first insulating film formed on a semiconductor substrate; forming an etching mask on the gate electrode material layer; forming a gate electrode by patterning the gate electrode material layer such that a protective film that protects at least a lower portion of a side face of the gate electrode and a portion of the first insulating film, which is adjacent to the side face, is formed while the gate electrode material layer is patterned; forming a second insulating film on the semiconductor substrate on which the gate electrode is formed, such that the second insulating film covers the protective film and the etching mask on the gate electrode; and forming an interlayer insulation film on the second insulating film covering the protective film and the etching mask on the gate electrode.

Further features of the present invention will become apparent from the following description of exemplary embodiments with reference to the attached drawings.

DESCRIPTION OF THE EMBODIMENTS

Figure 1A:
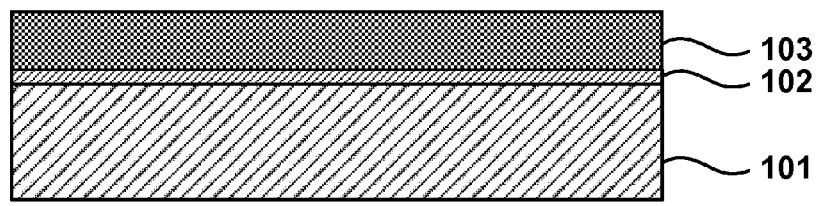
FIGS. 1A to 1F are views for explaining a method for manufacturing a semiconductor device of an embodiment of the present invention.

One embodiment of the present invention is directed to a method for manufacturing a semiconductor device including MOS transistors. The method for manufacturing a semiconductor device including MOS transistors will be explained below as one embodiment of the present invention with reference to FIGS. 1A to 1F. First, in a step shown in FIG. 1A, a first insulating film 102 is formed on a semiconductor substrate 101, and a gate electrode material layer 103 is formed on the first insulating film 102. The semiconductor substrate 101 can be a silicon substrate. The first insulating film 102 can be a silicon oxide film formed by thermally oxidizing the silicon substrate. The gate electrode material layer 103 can be a polysilicon layer. The gate electrode material layer 103 can be formed by, for example, CVD.

Figure 1B:
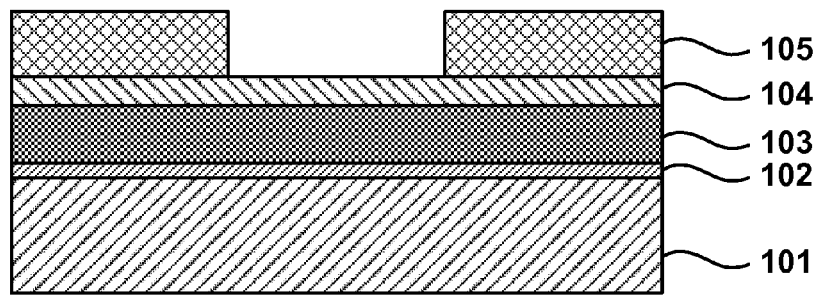
Figure 1C:
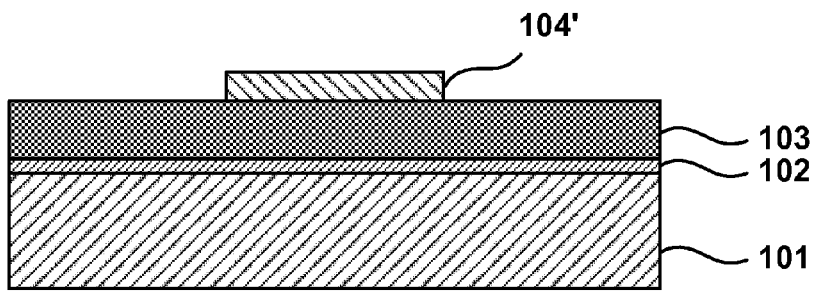

Then, in steps shown in FIGS. 1B and 1C, an etching mask 104' is formed on the gate electrode material layer 103. More specifically, in the steps shown in FIGS. 1B and 1C, an insulating film 104 is formed on the gate electrode material layer 103, and a photoresist pattern 105 is formed on the insulating film 104. Subsequently, the insulating film 104 is etched by using the photoresist pattern 105 as a mask. Consequently, the insulating film 104 is patterned, and the etching mask 104' is formed. The photoresist pattern 105 can be removed after the formation of the etching mask 104'. The insulating film 104 can be a silicon oxide film.

Figure 1D:
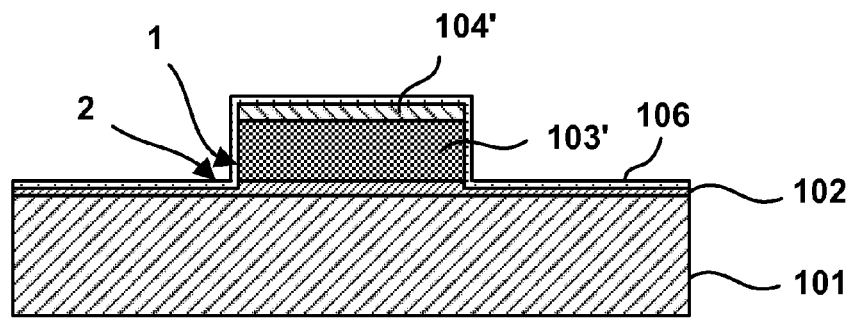

In a step shown in FIG. 1D, a gate electrode 103' is formed by patterning the gate electrode material layer 103. In this step, the gate electrode material layer 103 is patterned, and a protective film 106 for protecting at least a lower portion 1 of the side face of the gate electrode 103' and a portion 2, which is adjacent to the side face of the gate electrode 103', of the first insulating film 102 is formed. The protective film 106 is typically also formed on the etching mask 104' and/or gate electrode material layer 103. In the example shown in FIG. 1D, the protective film 106 is continuously formed to cover the side faces of the gate electrode 103', the etching mask 104', and the gate electrode material layer 103. The gate electrode material layer 103 is patterned by etching away those portions of the gate electrode material layer 103, which are not covered with the etching mask 104'. As a gas for etching the gate electrode material layer 103, it is possible to use, for example, a gas mixture of $Cl_2$, HBr, and $O_2$. The protective film 106 can be formed by a reaction between silicon produced by the etching of the gate electrode material layer 103 and the gas used for the etching, that is, as a byproduct of the etching of the gate electrode material layer 103. Alternatively, the protective film 106 can be formed by introducing a gas for depositing the protective film 106 into a processing chamber after the etching of the gate electrode material layer 103 is complete. An example of it is increasing the flow rate of HBr. Note that in the etching of the gate electrode material layer 103, the thickness of the etching mask 104' and that of the exposed portion of the gate electrode material layer 103 may decrease.

Figure 1E:
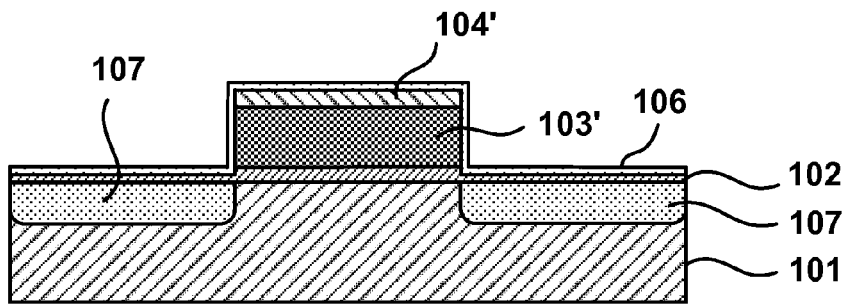
Figure 1F:
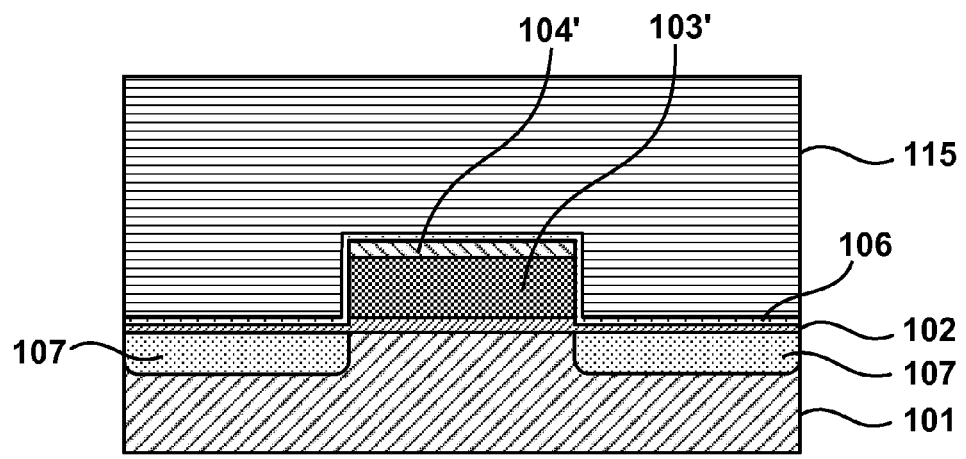

In a step shown in FIG. 1E, diffusion regions 107 are formed by implanting ions into the semiconductor substrate 101 in the presence of the protective film 106. The diffusion regions 107 form, for example, a source region and drain region. Then, in a step shown in FIG. 1F, an insulating film such as an interlayer insulation film 115 (an example of a second insulating film) is formed on the protective film 106.

In this step, forming the insulating film so as to cover the protective film 106 that was formed during forming the gate electrode 103' means that the insulating film is formed without removing the formed protective film 106. This is effective for preventing the formation of undercuts as described previously, and the prevention of the formation of undercuts is advantageous for suppressing the variations in characteristics (for example, the threshold value and current driving capability) of a MOS transistor. On the other hand, undercuts as described previously may be formed if wet etching or the like for removing the protective film 106 formed when forming the gate electrode 103' is performed.

Figure 2:
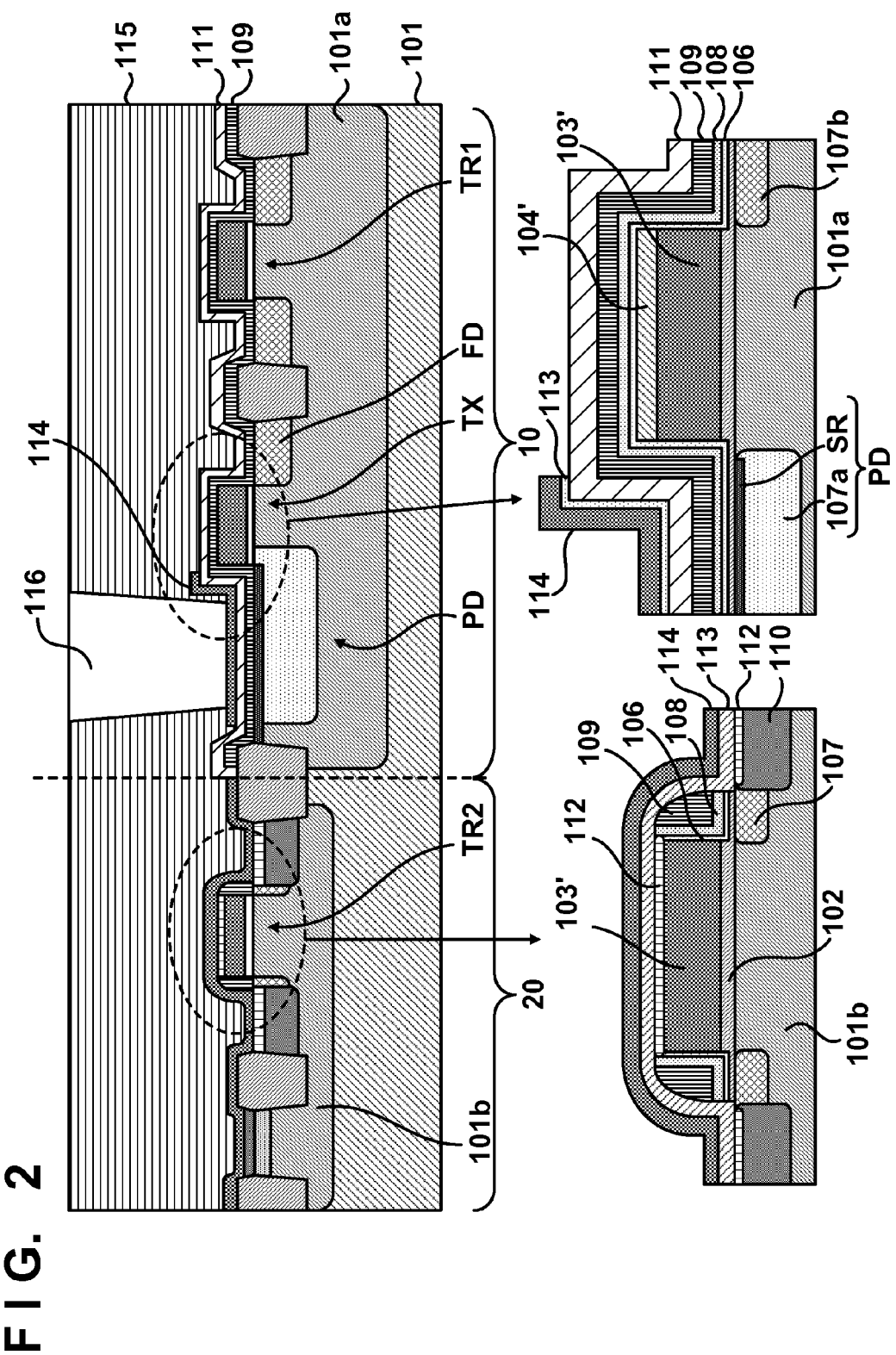
FIG. 2 is a schematic sectional view showing a part of a pixel portion and a part of a peripheral portion of a solid-state image sensor as an example of the semiconductor device.

An example in which the above-mentioned method of manufacturing a semiconductor device is applied to the manufacture of the solid-state image sensor will be explained below. FIG. 2 is a schematic sectional view showing the arrangement of the solid-state image sensor as an example of the semiconductor device. This solid-state image sensor includes a pixel portion 10 in which pixels having a photoelectric converter PD are arranged, and a peripheral circuit portion 20 for reading out pixel signals from the pixel portion 10. As typical elements of the pixel portion 10, FIG. 2 shows one photoelectric converter PD, a transfer MOS transistor (transfer gate) TX for transferring charge accumulated in the photoelectric converter PD to a floating diffusion FD, and one MOS transistor TR1. The MOS transistor TR1 can be, for example, an amplification transistor, reset transistor, or selection transistor. A diffusion region forming the photoelectric converter PD, floating diffusion FD, transfer MOS transistor TX, and MOS transistor TR1 can be formed in, for example, a well 101a formed in the semiconductor substrate 101. As a typical element of the peripheral circuit portion 20, FIG. 2 shows one MOS transistor TR2. A diffusion region forming the MOS transistor TR2 can be formed in, e.g., a well 101b formed in the semiconductor substrate 101.

In the pixel portion 10, MOS transistors including the transfer MOS transistor (transfer gate) TX and MOS transistor TR1 are formed. Insulating films such as a silicon oxide film 108, silicon nitride film 109, silicon oxide film 111, and interlayer insulation film 115 (these films are examples of second insulating films) are formed on the protective film 106 that covers the MOS transistors. In the peripheral circuit portion 20, the protective film 106 is removed from the upper face of the gate electrode 103' of the MOS transistor TR2. However, the protective film 106 remains between side spacers (the silicon oxide film 108 and silicon nitride film 109; examples of second insulating films) and the gate electrode 103' and between the side spacers and the gate insulating film (first insulating film 102). Other constituent elements shown in FIG. 2 will be explained with reference to FIGS. 3A to 3C, 4A to 4C, 5A to 5C, 6A to 6D, and 7A to 7C.

FIGS. 3A to 3C, 4A to 4C, and 5A to 5C illustrate a method for forming the MOS transistor in the peripheral circuit portion 20. FIGS. 6A to 6D and 7A to 7C illustrate a method for forming the photoelectric converter PD and MOS transistors in the pixel portion 10.

Figure 3A:
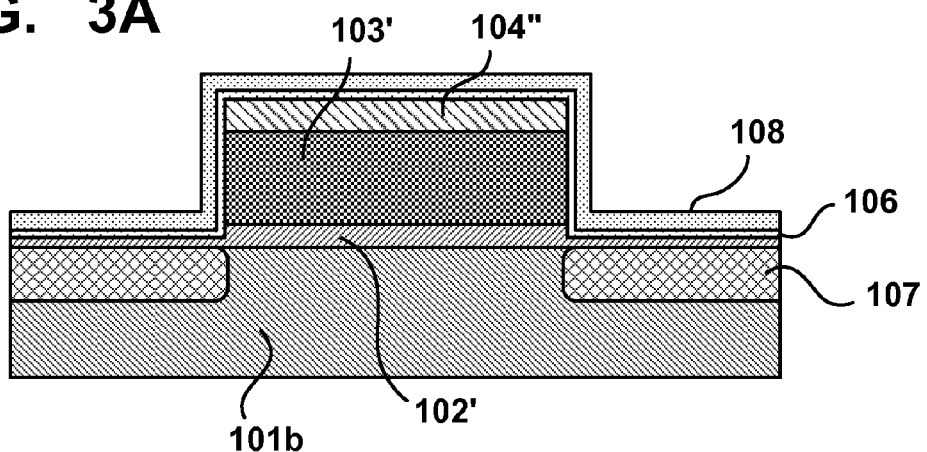
FIGS. 3A to 3C are views for explaining the process of manufacturing a MOS transistor in a peripheral circuit portion of the solid-state image sensor.
Figure 6A:
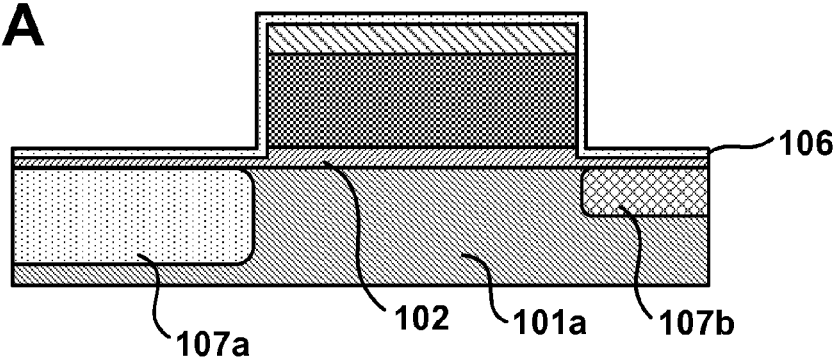
FIGS. 6A to 6D are views for explaining the process of manufacturing a MOS transistor in the pixel portion of the solid-state image sensor.
Figure 6B:
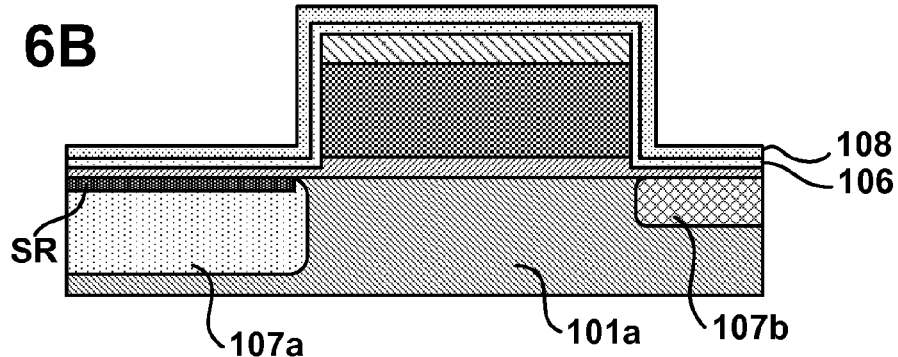

In the peripheral circuit portion 20, diffusion regions 107 for forming a source region and drain region are formed by ion implantation as shown in FIG. 3A after the steps shown in FIGS. 1A to 1D. In the pixel portion 10, an impurity region (for example, an N-type impurity region for accumulating charge) 107a of the photoelectric converter PD is formed as shown in FIG. 6A after the steps shown in FIGS. 1A to 1D. Also, an impurity region (for example, an N-type impurity region) 107b as the drain of the transfer MOS transistor TX and as the floating diffusion FD is formed by ion implantation. Then, as shown in FIG. 6B, an impurity region SR having a conductivity type different from that of the impurity region 107a is formed in the upper portion of the impurity region 107a by ion implantation. Consequently, a buried photoelectric converter PD is formed.

Figure 3B:
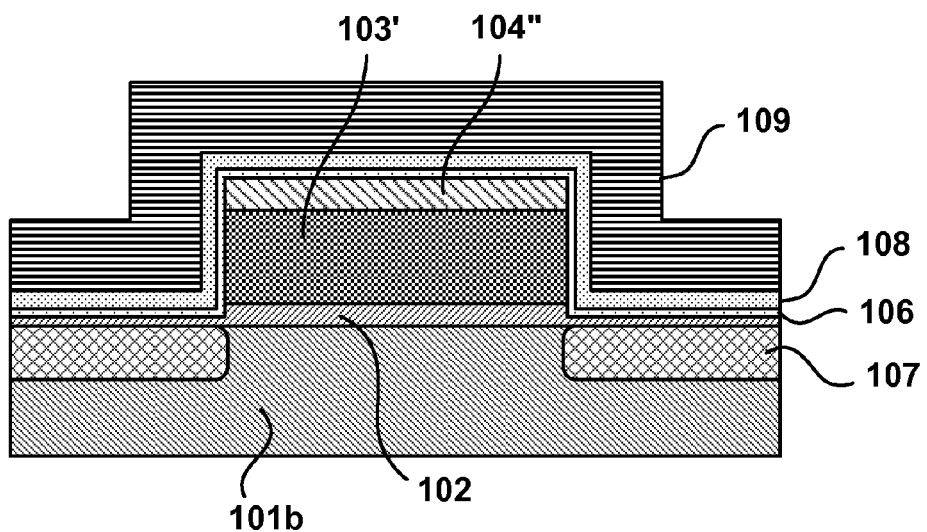
Figure 3C:
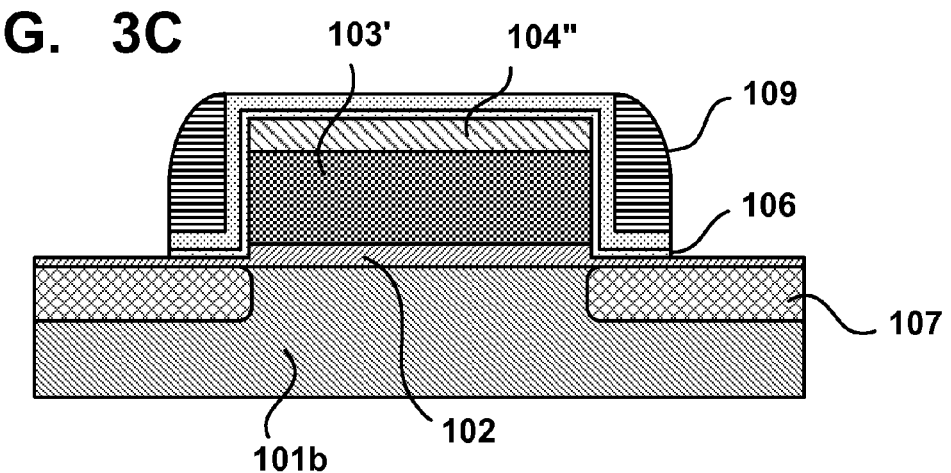
Figure 6C:
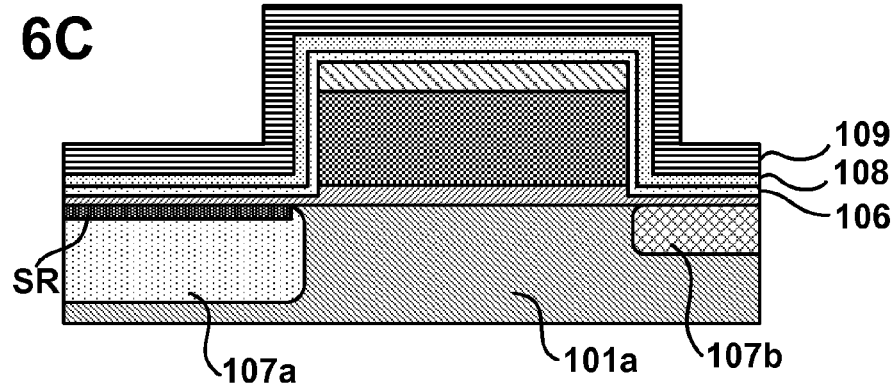
Figure 6D:
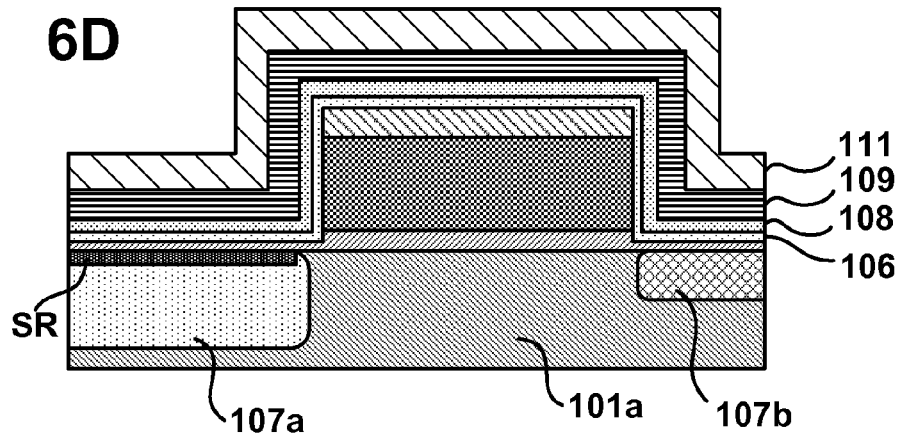

Subsequently, as shown in FIGS. 3A and 6B, a silicon oxide film 108 such as a TEOS film is formed in both the peripheral circuit portion 20 and pixel portion 10. As shown in FIGS. 3B and 6C, a silicon nitride film 109 is formed in both the peripheral circuit portion 20 and pixel portion 10. As shown in FIG. 3C, the pixel portion 10 is covered with a photoresist mask, and the silicon nitride film 109 and silicon oxide film 108 in the peripheral circuit portion 20 are etched. In the peripheral circuit portion 20, therefore, those portions of the silicon nitride film 109 and silicon oxide film 108, which cover the side faces of the gate electrode 103' remain. The silicon nitride film 109 and silicon oxide film 108 thus remaining form side spacers covering the side faces of the gate electrode 103'. In this step, etching can also be performed until the mask 104' is exposed. In this case, the height of the side spacers becomes smaller than that of the arrangement shown in FIG. 3C.

Figure 4A:
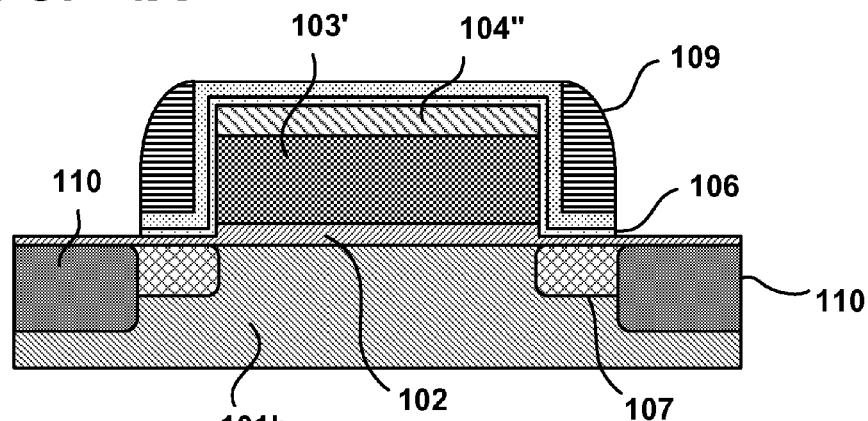
FIGS. 4A to 4C are views for explaining the process of manufacturing the MOS transistor in the peripheral circuit portion of the solid-state image sensor.

In the peripheral circuit portion 20, ion implantation is further performed in the diffusion regions 107 as shown in FIG. 4A. In this step, more ions are implanted into regions where no side spacer exists than in regions where the side spacers exist, thereby forming a source region and drain region having a so-called LDD structure. After that, the photoresist mask in the pixel portion 10 is removed.

Figure 4B:
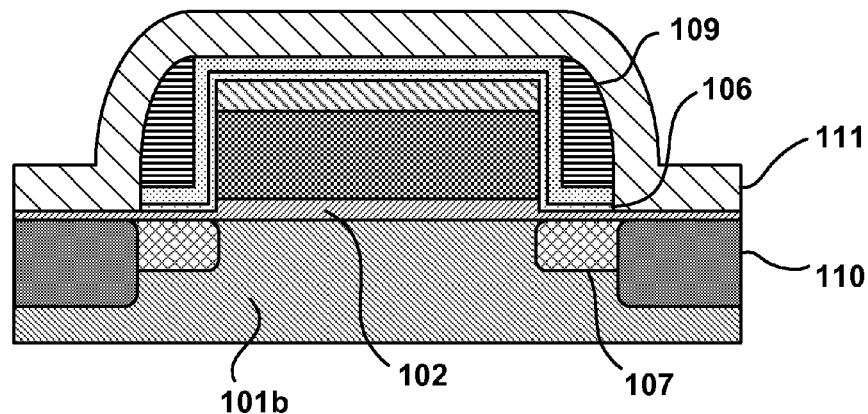
Figure 4C:
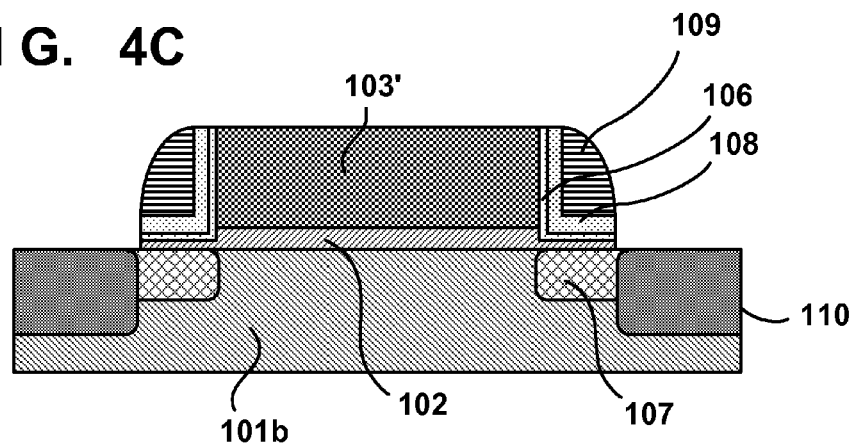

As shown in FIGS. 4B and 6C, a silicon oxide film 111 is formed in both the peripheral circuit portion 20 and pixel portion 10. Then, the pixel portion 10 is covered with a photoresist mask, and the peripheral circuit portion 20 is etched. Consequently, as shown in FIG. 4C, the protective film 106 and etching mask 104' covering the upper face of the gate electrode 103' are removed, and the upper face of the gate electrode 103' is exposed. The silicon oxide film 111 remains to cover the pixel portion 10, and functions as a layer for preventing the formation of silicide when forming silicide as will be described below. That is, the silicon oxide film 111 is left behind so as to cover only portions where no silicide is to be formed. The silicon oxide film 111 can exist not only in the pixel portion 10 but also in the peripheral circuit portion 20.

Figure 5A:
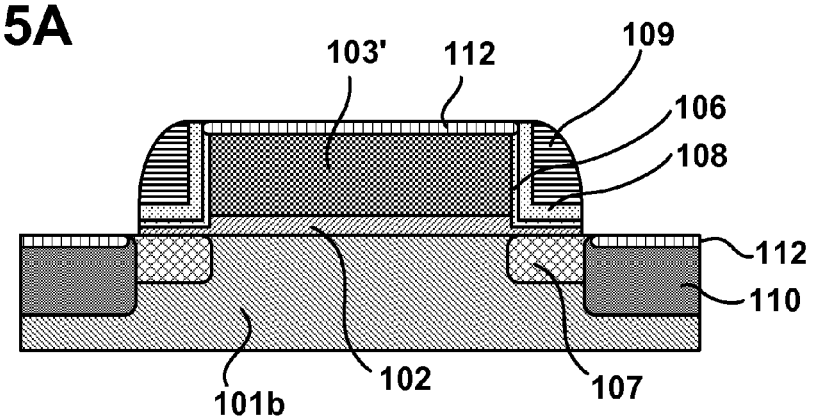
FIGS. 5A to 5C are views for explaining the process of manufacturing the MOS transistor in the peripheral circuit portion of the solid-state image sensor.

Subsequently, a high melting point metal such as cobalt is deposited in both the peripheral circuit portion 20 and pixel portion 10, and annealing is performed. Consequently, in the peripheral circuit portion 20 as shown in FIG. 5A, the high melting point metal reacts with silicon in the upper portion of the gate electrode 103' and forms silicide (for example, cobalt silicide) 112. Note that no silicide is formed in the pixel portion 10 because the high melting point metal is deposited on the silicon oxide film 111.

Figure 5B:
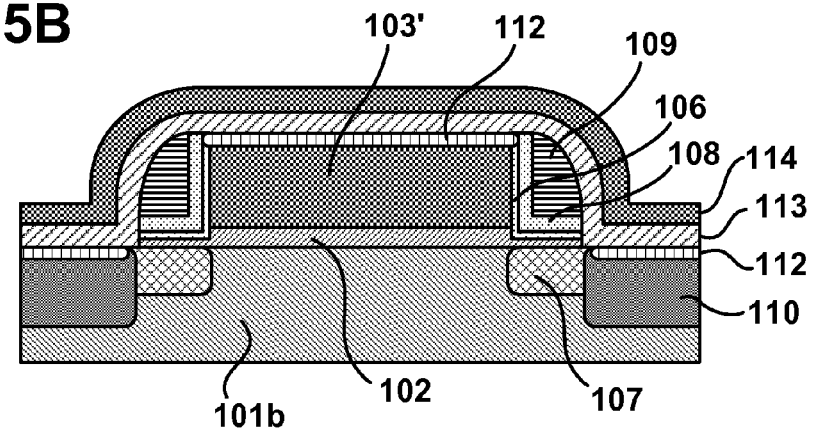
Figure 7A:
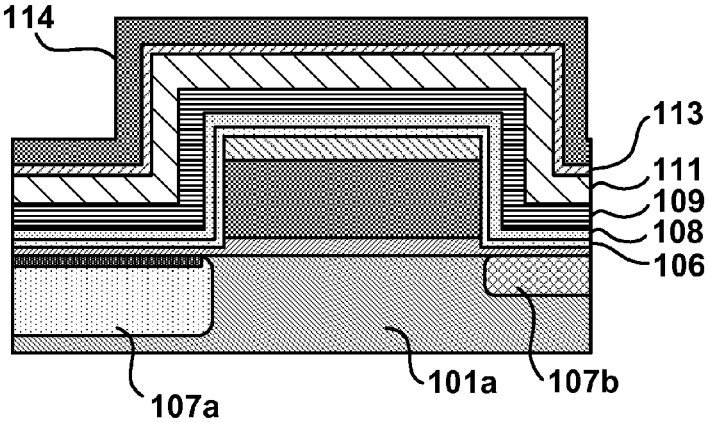
FIGS. 7A to 7C are views for explaining the process of manufacturing the MOS transistor in the pixel portion of the solid-state image sensor.

As shown in FIGS. 5B and 7A, a silicon oxide film 113 is formed in both the peripheral circuit portion 20 and pixel portion 10, and a silicon nitride film 114 is formed on the silicon oxide film 113.

Figure 5C:
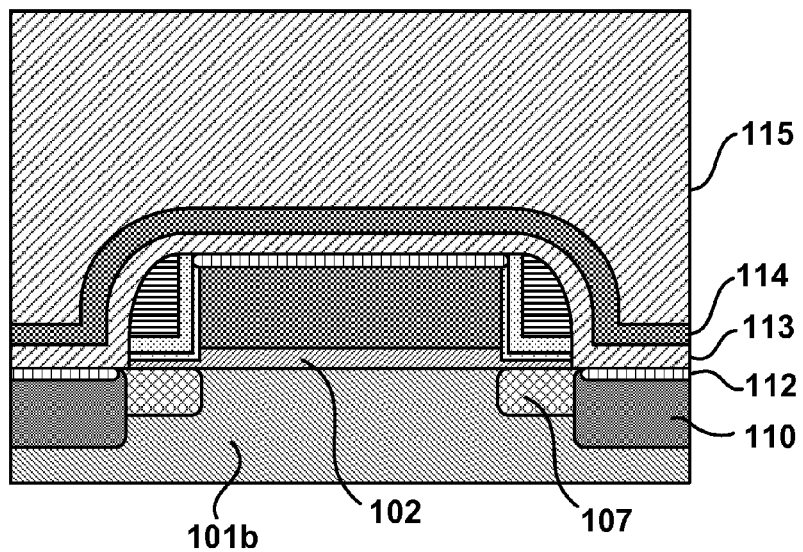
Figure 7B:
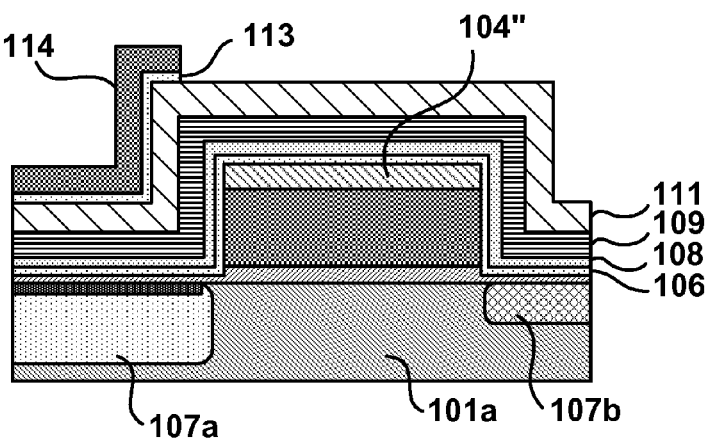
Figure 7C:
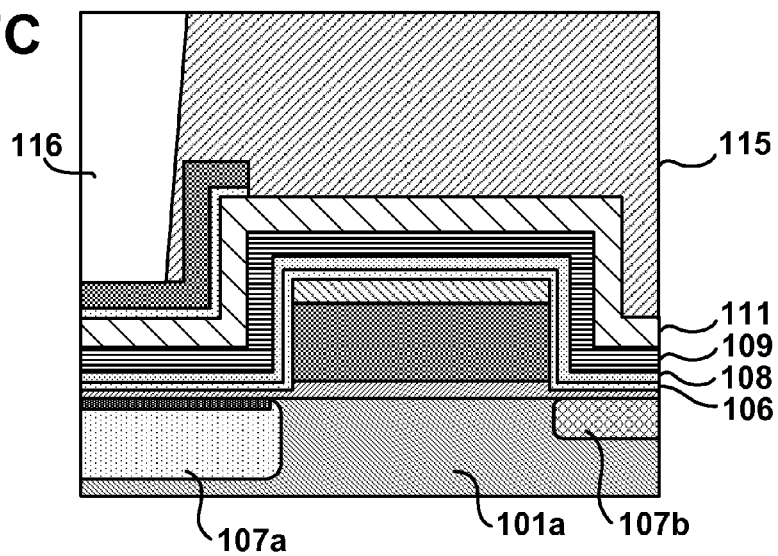

As shown in FIGS. 5B and 7B, the silicon oxide film 113 and silicon nitride film 114 are removed from regions of the pixel portion 10 except for the region above the photoelectric converter PD. Then, as shown in FIGS. 5C and 7C, an interlayer insulation film 115 is formed in both the peripheral circuit portion 20 and pixel portion 10. Subsequently, as shown in FIG. 7C, it is also possible to form an opening in that portion of the interlayer insulation film 115, which is positioned above the photoelectric converter PD of the pixel portion 10, and bury a high-refractive-index material such as silicon nitride in this opening, thereby forming an optical waveguide. After that, contact plugs and interconnections are formed by general semiconductor techniques, and optical members such as micro lenses are formed, thereby completing the solid-state image sensor. In a later contact plug formation step, the silicon nitride film 109 in the pixel portion 10 can function as an etching stop. Similarly, in the later contact plug formation step, the silicon nitride film 114 in the peripheral circuit portion 20 can function as an etching stopper.

The use of the optical waveguide is arbitrary. When using no optical waveguide, it is unnecessary to form the silicon oxide film 113 and silicon nitride film 114 formed in the region above the photoelectric converter PD of the pixel portion 10.

Figure 8A:
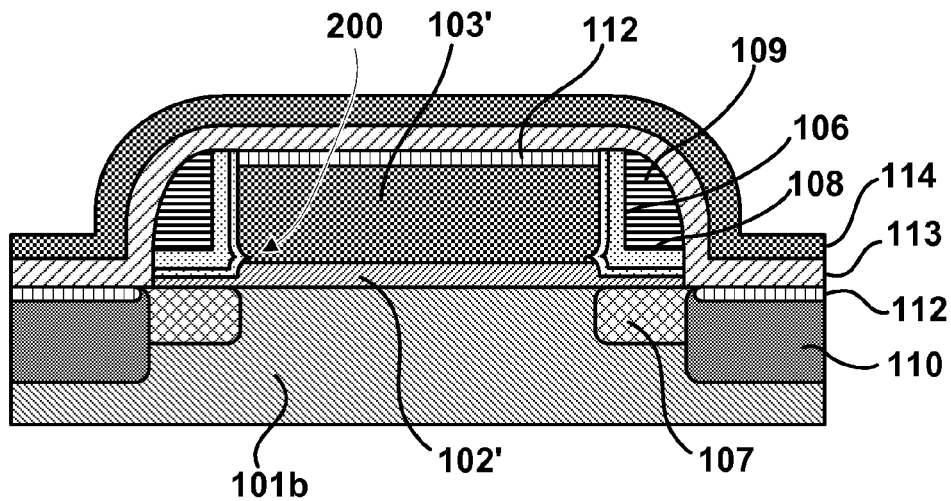
FIGS. 8A and 8B are views showing a modification.
Figure 8B:
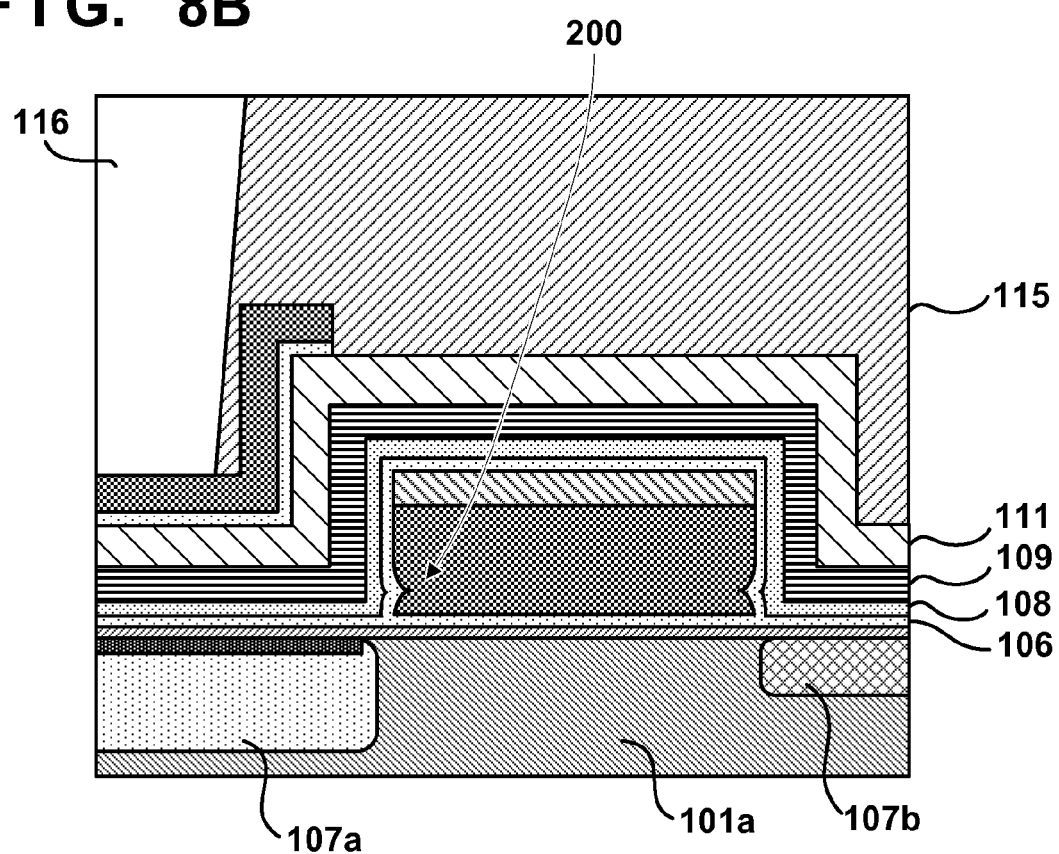

FIGS. 8A and 8B show a modification of the above-mentioned embodiment. FIG. 8A shows a configuration example of the MOS transistor in the peripheral circuit portion 20, and FIG. 8B shows a configuration example of the MOS transistor in the pixel portion 10. In this modification, in the step of forming the gate electrode 103', a constriction 200 is formed on the side faces of the gate electrode 103' between the upper and lower faces of the gate electrode 103'. Insulating films such as the interlayer insulation film 115, silicon oxide film 108, and silicon nitride film 109 (these insulating films are examples of second insulating films) are formed on the protective film 106 without removing it in this modification as well. This is effective for preventing the formation of undercuts as described previously, and the prevention of the formation of undercuts is advantageous for suppressing the variations in characteristics (for example, the threshold value and current driving capability) of the MOS transistor.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2011-222350, filed Oct. 6, 2011, which is hereby incorporated by reference herein in its entirety.

What is claimed is:

1. A method for manufacturing a semiconductor device including a MOS transistor, the method comprising:
    forming a gate electrode material layer on a first insulating film formed on a semiconductor substrate;
    forming an etching mask on the gate electrode material layer;
    forming a gate electrode by patterning the gate electrode material layer such that a protective film that protects at least a lower portion of a side face of the gate electrode and a portion of the first insulating film, which is adjacent to the side face, is formed while the gate electrode material layer is patterned;
    forming a second insulating film on the semiconductor substrate on which the gate electrode is formed, such that the second insulating film covers the protective film and the etching mask on the gate electrode; and
    forming an interlayer insulation film on the second insulating film covering the protective film and the etching mask on the gate electrode.

2. The method according to claim 1, wherein the forming the etching mask comprises:
    forming an insulating film on the gate electrode material layer; and
    patterning the insulating film.

3. The method according to claim 1, wherein
    the semiconductor device comprises a pixel portion including a photoelectric converter and a MOS transistor, and a peripheral circuit portion including a MOS transistor, and
    the method further comprises, between the forming the second insulating film and the forming the interlayer insulation film, forming a side spacer covering the side face of the gate electrode by etching a portion of the second insulating film, which is formed in the peripheral circuit portion.

4. The method according to claim 3, further comprising, between the forming the side spacer and the forming the interlayer insulation film, forming a third insulating film such that the third insulating film covers a portion of the second insulating film, which is formed in the pixel portion, and the side spacer.

5. The method according to claim 4, further comprising forming an opening in the interlayer insulation film in the pixel portion and forming a waveguide in the opening.

6. The method according to claim 5, wherein in the forming the opening in the interlayer insulation film in the pixel portion, the opening is formed by etching the interlayer insulation film, and the third insulating film is used as an etching stopper when etching the interlayer insulation film.

7. The method according to claim 1, wherein in the forming the gate electrode, a constriction is formed on the side face of the gate electrode between the upper face and lower face of the gate electrode.

8. The method according to claim 1, wherein
    the semiconductor device comprises a pixel portion including a photoelectric converter and a MOS transistor, and a peripheral circuit portion including a MOS transistor, and
    the method further comprises forming an opening in the interlayer insulation film in the pixel portion and forming a waveguide in the opening.

* * * * *